United States Patent [19]
Trottier et al.

[11] Patent Number: 5,933,042
[45] Date of Patent: Aug. 3, 1999

[54] ACTIVE QUENCH CIRCUIT FOR AN AVALANCHE CURRENT DEVICE

[75] Inventors: Claude J. Trottier, Laval; Pierre D. Deschamps, Pincourt; Bruno Y. Dion, Vaudreuil, all of Canada; Alain R. Comeau, Järfälla, Sweden

[73] Assignee: EG&G Canada, Ltd., Canada

[21] Appl. No.: 08/886,300

[22] Filed: Jul. 1, 1997

[51] Int. Cl.⁶ .................................................. H03K 5/08
[52] U.S. Cl. .......................................................... 327/326
[58] Field of Search ..................................... 327/320, 323, 327/326, 502, 584, 514, 538; 250/214 R

[56] References Cited

U.S. PATENT DOCUMENTS

| | | | |
|---|---|---|---|
| 4,001,614 | 1/1977 | Dahlinger | 327/514 |
| 4,303,861 | 12/1981 | Ekstrom | 250/370 |
| 4,389,695 | 6/1983 | Carpenter, Jr. | 361/55 |
| 4,479,052 | 10/1984 | Suzuki | 250/214 R |
| 4,574,249 | 3/1986 | Williams | 330/59 |
| 4,730,128 | 3/1988 | Seki | 250/214 C |
| 4,754,131 | 6/1988 | Bethea et al. | 250/211 J |
| 4,762,107 | 8/1988 | Schoneck et al. | 123/478 |
| 4,945,227 | 7/1990 | Jones et al. | 250/214 R |
| 4,963,727 | 10/1990 | Cova | 250/214 R |
| 5,130,526 | 7/1992 | Mischel et al. | 250/214 R |
| 5,168,154 | 12/1992 | Harley | 250/214 R |
| 5,194,727 | 3/1993 | Johnson et al. | 250/214 R |
| 5,747,836 | 5/1998 | Mariyama | 257/119 |

FOREIGN PATENT DOCUMENTS

89202618  10/1989  European Pat. Off. .

OTHER PUBLICATIONS

Brown et al., "Characterization of silicon avalanche photodiodes for photon correlation measurements. 2: Active quenching", Applied Optics, vol. 26, No. 12, Jun. 15, 1987.

*Primary Examiner*—My-Trang Nu Ton
*Attorney, Agent, or Firm*—Iandiorio & Teska; Brian J. Colandreo

[57] ABSTRACT

An active quench circuit for an avalanche current device applies a bias voltage to reverse bias an avalanche current device above its avalanche breakdown voltage; a current amplifier circuit having a turn-off speed slower than the avalanche speed of the avalanche device and responsive to the avalanche current of the avalanche device generates an overshoot current continuing after the end of the avalanche current; and a feedback circuit responsive to the overshoot current generates a quenching voltage for reducing the bias voltage below the avalanche breakdown voltage to quench the avalanche current of the avalanche device.

19 Claims, 7 Drawing Sheets

ACTIVE QUENCH CIRCUIT FOR AN AVALANCHE CURRENT DEVICE

FIELD OF INVENTION

This invention relates to an active quench circuit for an avalanche current device, and more particularly to such a quench circuit which utilizes the slow turn-off speed of a current amplifier to generate a quenching voltage after the avalanche current has subsided.

BACKGROUND OF INVENTION

The avalanche photodiode (APD) is a semiconductor device that can detect extremely low levels of electromagnetic radiation. Unlike a PIN photodiode, which generally produces a single electron for each photon received, an APD is constructed so that an electron dislodged by a photon will hit other atoms in the APD semiconductor lattice with sufficient velocity and energy so that additional hole-electron pairs are created by the collisions. Typically a free electron will create a number of hole-electron pairs, and the electrons from these pairs will, in turn, create additional electrons, thus creating an "avalanche" process. This multiplication of the electrons gives the APD an effective gain and allows the detection of very low light levels.

Recent advances in the fabrication and performance of the avalanche photodiodes (APD's) have led to their use in the detection of individual photons and other short-duration events. Although APD's have obvious advantages over photomultiplier tubes, including power requirements, size, and quantum efficiency, until recently, photomultiplier tubes have been required to get sufficient sensitivity and speed in these applications. When used in the single photon detection applications, APD's are frequently used in "Geiger" mode in which the APD is reverse biased to a voltage that exceeds its breakdown voltage. In geiger mode, some means is necessary to stop or "quench" the current flowing through the diode after each avalanche.

One method to quench the current is to limit the maximum current flowing through the diode, by means of a series resistor, to a low enough level that the current will spontaneously cease due to the statistical nature of the avalanche process. While using this simple circuitry, the minimum interval between detectable events is limited by the so-called "dead time": the time required to turn off the diode completely and to recharge it, and any other parasitic or intrinsic capacitance associated with the diode, through the typically large current limiting resistor which results in a large RC time constant.

These so-called passive quenching circuits are reverse biased through a biasing means such as a series resistance by applying a high voltage, $V_{RB}$, comprised of the breakdown voltage, $V_{BR}$, plus the overvoltage $\Delta V$ across the avalanche device of which avalanche photodiodes are but one example. When an event such as a thermal energy application or impingement of a photon occurs in the case of an avalanche photodiode the avalanche current begins to flow, the junction between the resistance means for biasing and the avalanche photodiode rises toward $\Delta V$, and the voltage across the photodiode approaches the breakdown voltage $V_{BR}$. Eventually the voltage at the junction stanches the avalanche current. The system will only reach full sensitivity when the discharge is completed and reset in the time dictated by the RC time constant which is typically long.

To shorten the resetting time active quench circuits were developed which, for example, may use a comparator to sense the onset of an avalanche current and through the action of a monostable circuit apply a voltage of $\Delta V$ plus an excess voltage $V_X$ to the junction of the biasing resistor and avalanche photodiode to drive it safely below $V_{BR}$ and stop the avalanche current. And after a short delay, typically applied through another monostable circuit, a switch is closed to ground from that junction to quickly recharge the intrinsic capacitance of the avalanche photodiode. Although this reduces the "dead time" by circumventing the RC time constant delay suffered by the passive quenching circuits it introduces substantial parasitic or intrinsic capacitance. This additional capacitance increases the charge flow through the avalanche diode and adds to the heating effect too. These circuits also must operate at low signal levels to detect the avalanche onset at the earliest moment which makes them more sensitive to noise. Because they are using a high speed comparator, these circuits require more power to detect and stop the avalanche process. One example of an active quench circuit is shown in U.S. Pat. No. 5,532,474.

SUMMARY OF INVENTION

It is therefore an object of this invention to provide an improved active quench circuit for an avalanche current device.

It is a further object of this invention to provide such an improved active quench circuit which provides a faster reset of the avalanche device, a simpler and less expensive circuit and a reduction of the power consumption.

It is a further object of this invention to provide such an improved active quench circuit which operates at higher $\Delta V$ and consequent higher efficiency with faster reset times.

It is a further object of this invention to provide such an improved active quench circuit which reduces the amount of after-pulses.

It is a further object of this invention to provide such an improved active quench circuit which reduces heating of the avalanche current device.

It is a further object of this invention to provide such an improved active quench circuit which does not require expensive precision components to track and suppress the avalanche current.

It is a further object of this invention to provide such an improved active quench circuit which requires less power for quenching.

It is a further object of this invention to provide such an improved active quench circuit which is less susceptible to noise.

It is a further object of this invention to provide such an improved active quench circuit which reduces the time during which the device is reset and vulnerable to damaging current overload.

This invention results from the realization that instead of trying to sense the very beginning of the avalanche current and quickly injecting a quenching voltage to cut short the avalanche process, the inherent speed of the avalanche phenomenon can be used to advantage by allowing it to continue to completion so that a truly simple, fast quench circuit can be effected by using a current amplifier circuit with a slower turn-off speed than the avalanche speed to track or follow the avalanche current but, because of its slow turn-off speed, to continue to conduct even after the avalanche current has ceased to thereby generate a current convertible to a voltage in excess of $\Delta V$, i.e., $\Delta V$ plus $V_X$ to quench the avalanche current and reset more quickly.

This invention features an active quench circuit for an avalanche current device including means for applying a bias voltage to reverse bias an avalanche current device above its avalanche breakdown voltage. A current amplifier circuit has a turn-off speed slower than the avalanche speed of the avalanche device and is responsive to the avalanche current of the avalanche device for generating an overshoot current continuing after the end of the avalanche current. A feedback circuit responsive to the overshoot current generates a quenching voltage for reducing the bias voltage below the avalanche breakdown voltage to quench the avalanche current of the avalanche device.

In a preferred embodiment there may be a reset circuit responsive to the quenching voltage to recharge the capacitance of the avalanche current device and discharge the intrinsic capacitances of the current amplifier circuit and the feedback circuit for reestablishing the bias voltage above the avalanche breakdown voltage. The reset circuit may include an inhibit means for selectively inhibiting the application of the quenching voltage to the reset circuit. The reset circuit may include switching means for discharging the intrinsic capacitances of the current amplifier and feedback circuit and recharging the avalanche current device. The reset circuit may also include pulse generating means for producing a pulse to operate the switching means for a predetermined period of time. The reset means may also include delay means responsive to the current amplifier circuit for actuating the pulse generating means after the quench voltage has been generated. There may be gating means for actuating the inhibit means and applying an equivalent quenching voltage to the avalanche current device to maintain the avalanche current device below the avalanche breakdown voltage while the reset circuit is inhibited. The current amplifier circuit may include a bipolar transistor having a turn-off speed slower than the avalanche speed of the avalanche device. The feedback circuit may include a high impedance, low capacitance semiconductor buffer interconnected between the avalanche device and the means for applying a bias for selectively current isolating the bipolar transistor and avalanche device. The semiconductor buffer may have a faster turn-off and turn-on speed than the bipolar transistor. The feedback circuit may include a quenching capacitor for generating the quenching voltage from the overshoot current. The switching means may include a first switching device interconnected at a junction with the means for applying for recharging the intrinsic capacitance of the avalanche device and discharging the intrinsic capacitances at the input of the current amplifier circuit. The switching means may include a second switching device interconnected at the junction with the bipolar transistor and semiconductor buffer for discharging their intrinsic capacitances. The switching device may include a third switching device interconnected with the quenching capacitor for discharging it. The feedback circuit may include a Schottky diode for interconnecting the quenching voltage to the means for applying, or it may include a feedback capacitor, or it may include the intrinsic capacitances of the bipolar transistor and/or that of the switching device for interconnecting the quenching voltage to the means for applying.

DISCLOSURE OF PREFERRED EMBODIMENT

Other objects, features and advantages will occur to those skilled in the art from the following description of a preferred embodiment and the accompanying drawings, in which.

Figure 1:
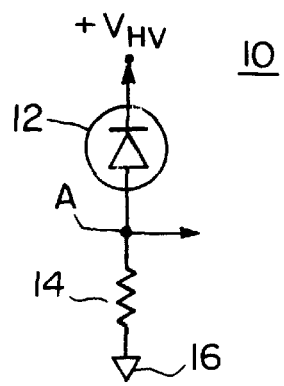
FIG. 1 is a schematic diagram of a prior art passive quench circuit for an avalanche diode.
Figure 2:
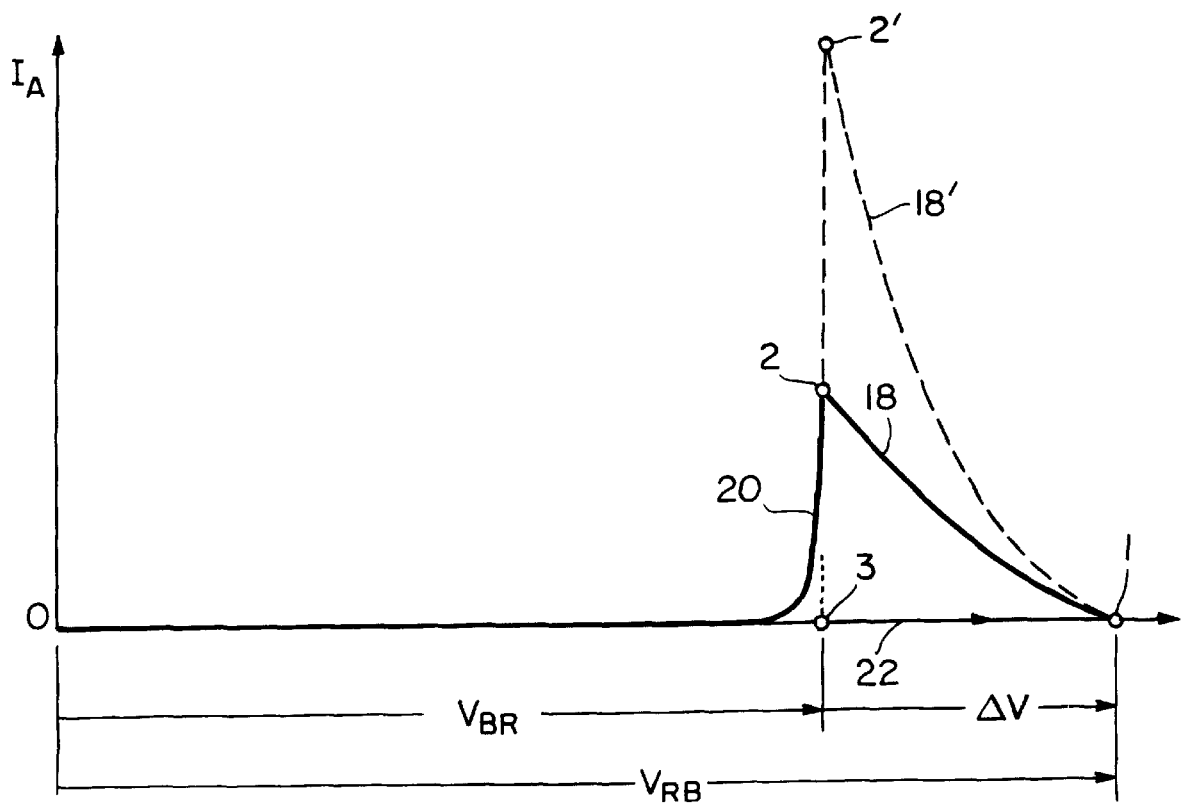
FIG. 2 is an illustration of the characteristic avalanche current during an avalanche and quench operation for the circuit of FIG. 1.

There is shown in FIG. 1 a prior art a prior art passive quench circuit 10 including an avalanche diode 12 and a biasing means, resistor 14. Resistor 14 is connected at junction A to the anode of avalanche device 12, and at its other end to ground 16. The cathode of avalanche current device 12 is connected to a high voltage $V_{HV}$ which applies the breakdown voltage $V_{BR}$ across avalanche device 12. Avalanche device 12 typically is an avalanche diode or an avalanche photodiode in which the avalanche current can be triggered either by photon impingement or by thermal energy. The voltage applied across avalanche device 12 is the reverse bias voltage $V_{RB}$ which is a combination of the breakdown voltage $V_{BR}$, FIG. 2, plus $\Delta V$. Initially then, no current is flowing through the avalanche device 12. Upon impingement of a photon or the introduction of thermal energy, the avalanche process begins and the current increases along path 18 to point 2. At this point the avalanche current flowing through resistance 14 has increased the voltage at point A from ground to $\Delta V$ so that the voltage across avalanche device 12 is at the breakdown voltage $V_{BR}$. The avalanche current now stops and the current goes to zero as shown at point 3. The avalanche current has now been stanched and the current decreases along path 20 to point 3. The system now resets from point 3 back to point 1 along the path 22 in a period of time dictated by the RC constant which is determined by the resistance of resistor 14 and the capacitance of the avalanche device 12. This can take a significant amount of time during which other photon impingements will not be detected. This is one of the shortcomings of such prior art devices. The path 18 from point 1 to point 2 actually depends upon the magnitude of the resistance 14. For a relatively large resistance the current is smaller; for a relatively small resistance, as shown by path 18', the current is larger. If this resistance is too small then the current never stops. This phenomena, well known in the art, is called the latch up effect.

Figure 3:
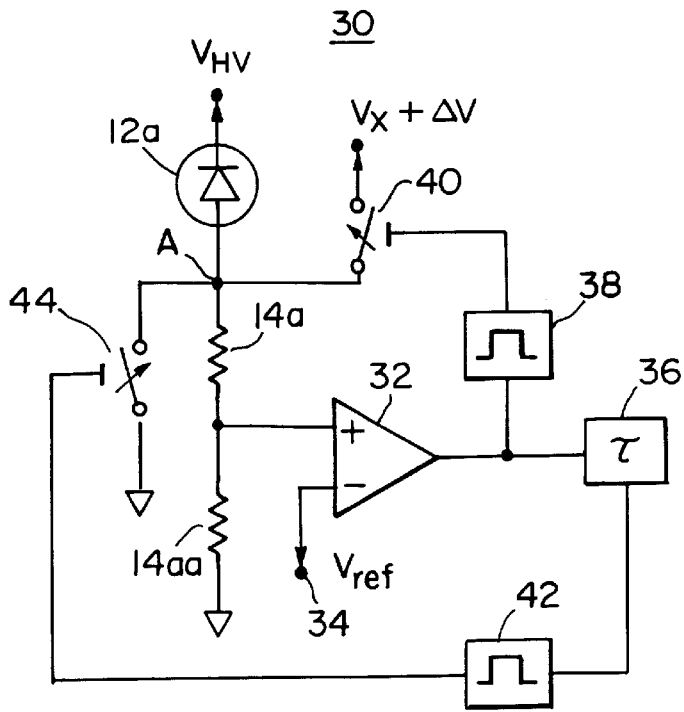
FIG. 3 is a schematic diagram of a prior art active quench circuit for an avalanche diode.
Figure 4:
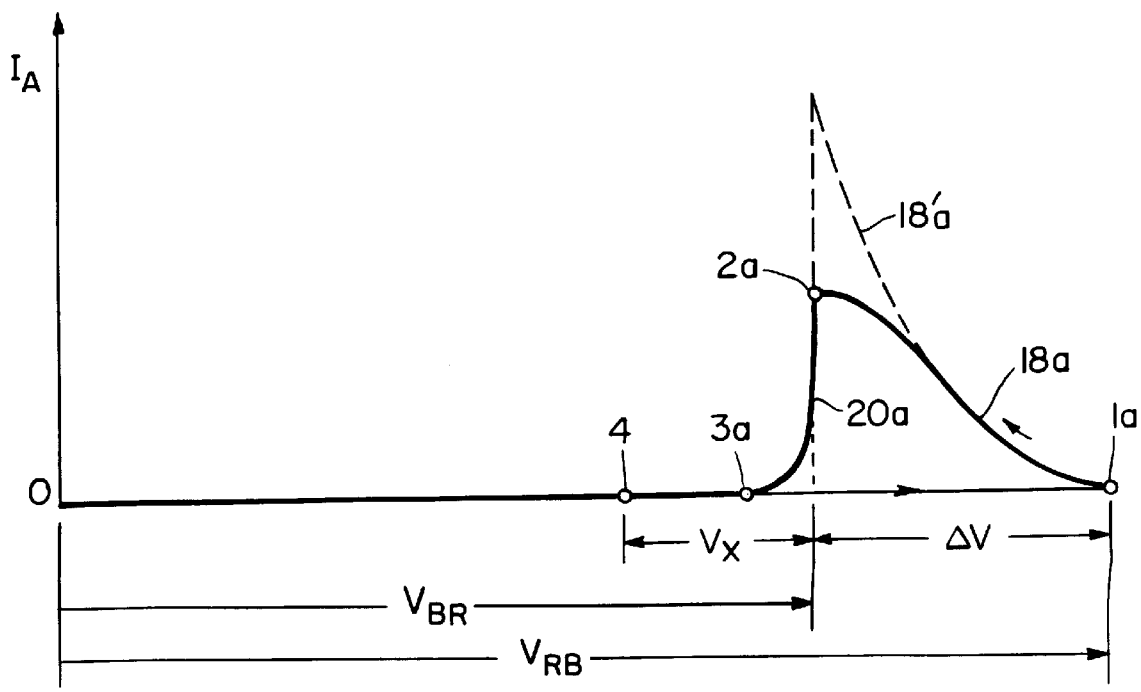
FIG. 4 is an illustration of the characteristic avalanche current during an avalanche and quench operation for the circuit of FIG. 3.

In order to overcome the slow response time of such devices, active quench circuits were developed. One example of a prior art active quench circuit 30, FIG. 3, uses a comparator 32 to sense the voltage through biasing resistors 14a, 14aa, with respect to a reference input 34. When the comparison suggests that an avalanche current is beginning to flow, comparator 32 provides an output to delay line 36 and to monostable circuit 38. Monostable 38 provides a momentary pulse to close switch 40 and apply a voltage $\Delta V$ to point A to quickly reduce the voltage from the reverse bias voltage $V_{RB}$ to and below the breakdown voltage $V_{BR}$. This stanches the avalanche current and stops the avalanche process. Meanwhile, after a short delay, delay circuit 36 actuates monostable circuit 42 to provide a momentary pulse to switch 44 to reset the circuit and recharge avalanche diode 12a. This cycle of operation is depicted in FIG. 4, where the circuit starts out at point 1a with the voltage applied being the reverse bias voltage $V_{RB}$. Assuming once again that avalanche device 12a is an avalanche photodiode and a photon has impinged upon it, the avalanche current begins and tracks along the path 18a, FIG. 4. Normally this would continue along path 18'a, but when comparator 32 detects that this current has begun to flow it actuates the monostable vibrator 30 to close switch 40 and apply $\Delta V$ and the excess voltage $V_X$ to junction A. This causes the path to follow the full line course and arrive at point 2a as the voltage drops an amount $\Delta V$ to the breakdown voltage $V_{BR}$. The action continues and the current and the voltage decrease along the path 20a to point 3 and beyond to point 4 where the quench is completed. At this point the system is reset by the action of timer 36, monostable circuit 42 and switch 44 so the system once again returns to point 1a.

Figure 5:
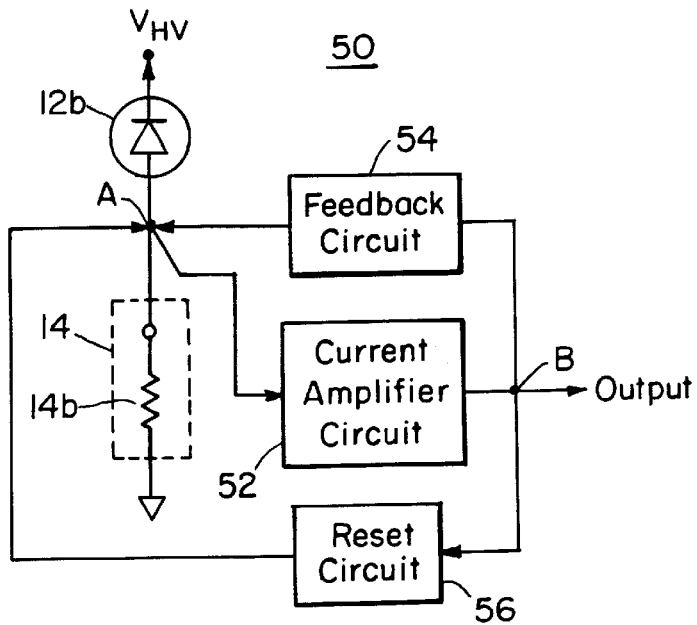
FIG. 5 is a schematic diagram of an active quench circuit for an avalanche photodiode according to this invention.

In accordance with this invention, active quench circuit 50, FIG. 5, includes an avalanche device such as an avalanche diode or avalanche photodiode 12b and a means for biasing it 14 such as resistor 14b which connects to it at junction A. Current amplifier circuit 52 is not a sensing circuit and does not seek to detect the early onset of the avalanche current. Rather, it simply follows the avalanche current and provides an output current which tracks the avalanche current. However, the turnoff time of the current amplifier circuit 52 is much slower than the speed of the avalanche current of avalanche device 12b. Thus when the avalanche current is stanched by the passive quenching of resistance 14b, current amplifier circuit 52 continues to produce a tracking current after the avalanche current has stopped. This tracking current is converted to a voltage and fed back to junction A by feedback circuit 54 and drives the voltage below the breakdown voltage to quench the circuit. Thus this circuit uses the inherent speed of the avalanche process rather than attempt to shortcut it. In taking this approach it does not require precision components and introduces very little capacitance so that the charge flowing is much smaller, the avalanche device is less susceptible to heating, and there is no external power required to stanch the avalanche process.

Figure 6:
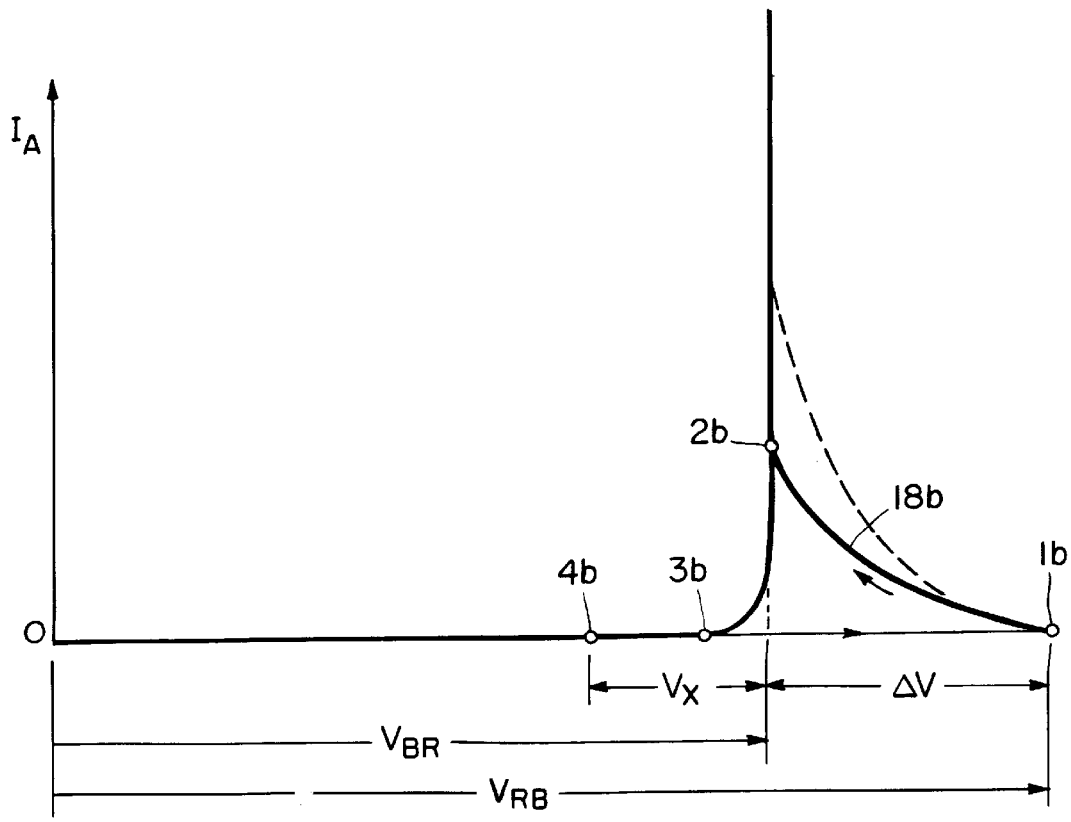
FIG. 6 is an illustration of the characteristic avalanche current during an avalanche and quench operation for the current of FIG. 5.

This can be seen more clearly with respect to FIG. 6, where initially the operation begins at point 1b with the circuit at its reverse bias voltage $V_{RB}$. When the avalanche process begins, current increases along path 18b to point 2b. There the avalanche current across resistance 14b builds up a voltage $\Delta V$, reducing the voltage across the avalanche device 12b to the breakdown voltage $V_{BR}$ so that the current no longer flows. Now the excess voltage $V_X$, instead of being injected from an external source, occurs because of the slow turn-off of current amplifier circuit 52 which continues to provide current after the avalanche current has ceased. The voltage developed from that overshoot current drives the voltage from the breakdown voltage $V_{BR}$ to a much lower voltage at point 4b by the excess voltage $V_X$ to completely quench the circuit. After the quench has been completed, reset circuit 56 recharges avalanche diode 12b and discharges what little intrinsic capacitance there is associated with current amplifier circuit 52 and feedback circuit 54 so the system returns to point 1b at the reverse bias $V_{RB}$. The output is taken from junction B at the output of current amplifier circuit 52.

Figure 7:
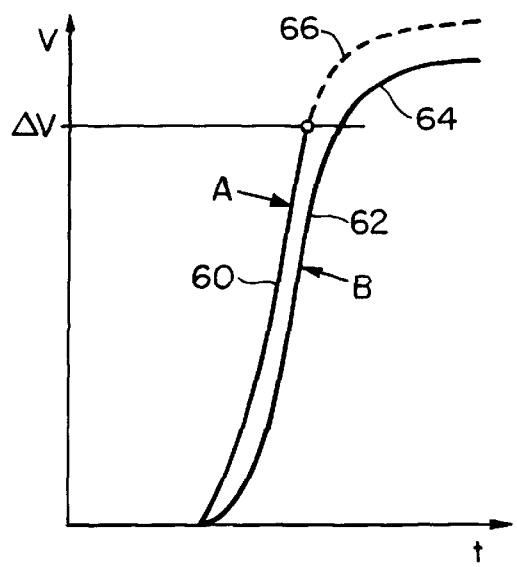
FIG. 7 is an illustration of the switching characteristic of the avalanche diode and current amplifier circuit of FIG. 5 showing generation of the overshoot current.

The effect of the slower turn-off current amplifier circuit 52 with respect to the higher speed avalanche current operation of avalanche device 12b is shown in FIG. 7 where $\Delta V$ is plotted against time for the voltages at junction A and junction B. There it can be seen that the voltage at junction A, that is, the voltage across avalanche device 12b, rises generally along path 60 until $\Delta V$ is reached. At that time the avalanche current ceases and the voltage increases no more. However, the voltage at B being driven by the overshoot current continues along path 62 and beyond $\Delta V$ along path 64. Because of this overshoot 64 a voltage is developed in excess of $\Delta V$ at junction A as indicated by the phantom path 66. This overvoltage is the excess voltage $V_X$ which quenches the circuit.

Figure 8:
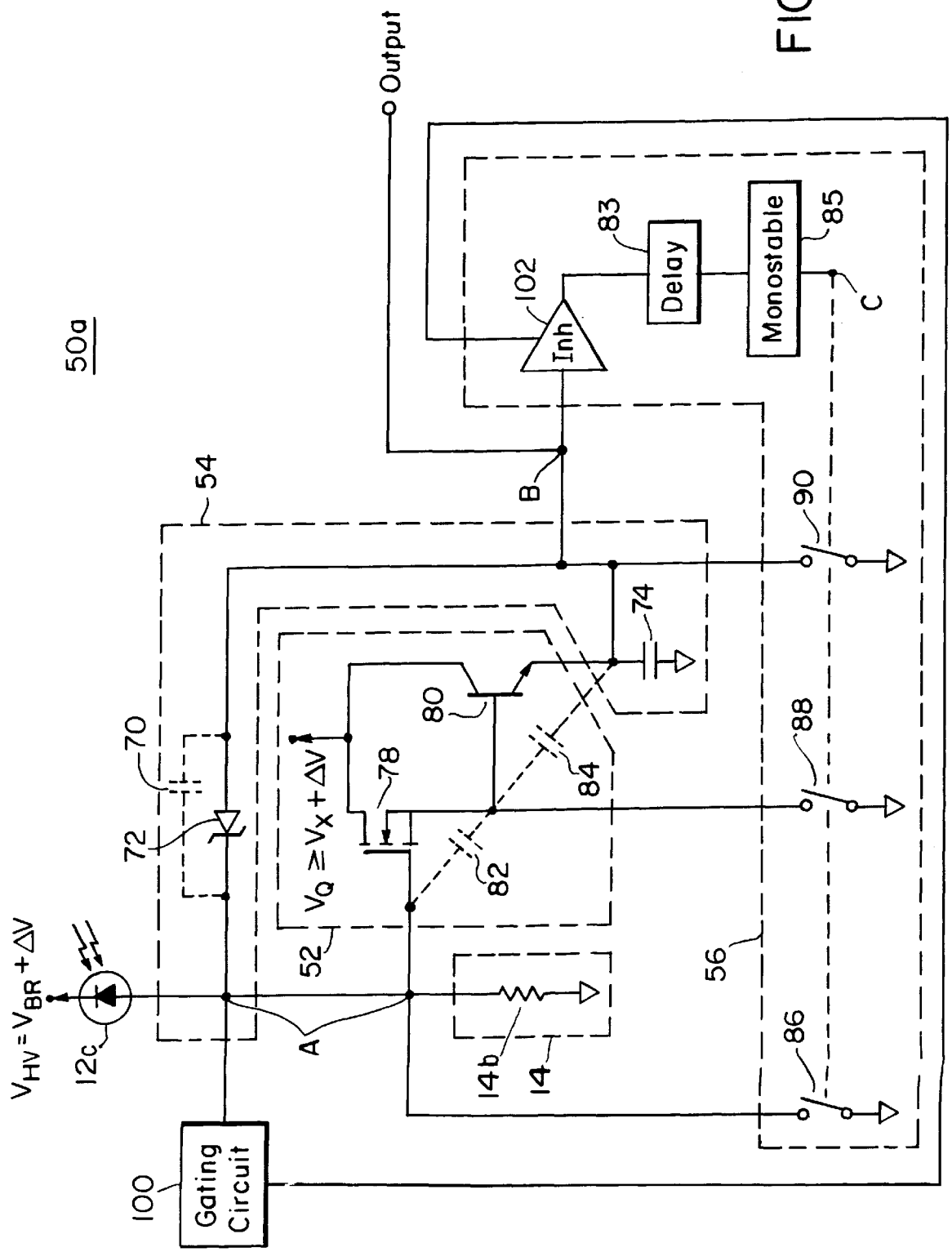
FIG. 8 is a more detailed schematic diagram of an embodiment of the active quench circuit of FIG. 5.

In one embodiment, feedback circuit 54, FIG. 8, includes a capacitance 70 or Schottky diode 72 which feeds back the signal to junction B with very low capacitance and a quenching capacitor 74 which converts the overshoot current to the quenching voltage delivered to junction B. Current amplifier circuit 52 may include a semiconductor switch or buffer such as an FET transistor 78 having a high impedance and low capacitance, and a conventional bipolar transistor such as NPN transistor 80 whose turn-off speed is slower than the speed of the avalanche current of the avalanche photodiode 12c. Avalanche photodiode 12c may be a C30902S or C30699. Resistance 14b is typically in the range of 250 kilo$\Omega$ to 1 meg$\Omega$. Transistor 78 may be an SST-211 and transistor 80 may be a 2N3246. The capacitance of Schottky diode 72 is approximately 0.5 pF. There is associated with each of transistors 78 and 80 intrinsic parasitic capacitance 82 and 84, respectively, approximate to 2 pF total or smaller due to the bootstrapping effect. Also, there is an additional 0.5 pF parasitic capacitance across the switch 42, for a global capacitance, seen by the avalanche photodiode 12c, of around 3 pF; much less than that of prior art active quench circuits.

Reset circuit 56 includes delay circuit 83 and monostable circuit 85 which provides a momentary pulse at junction C to operate switches 86, 88 and 90. When switch 86 is closed it connects ground to junction A, thereby recharging avalanche device 12c and discharging the capacitance associated with junction A such as the intrinsic capacitance 82 associated with transistor 78. When switch 88 is closed it connects ground to the base of transistor 80 where it discharges the intrinsic capacitances 82 and 84. When switch 90 is closed it connects ground to junction B and discharges quench capacitor 74. Actually, since all three switches 86, 88 and 90 are simultaneously momentarily closed, the capacitances are not actually discharged but have both terminals brought to ground simultaneously, making for a quick and complete reset. Gating circuit 100 may be added if it is desired to limit the times when photons are to be detected. For this purpose an inhibit circuit 102 is installed between junction B, the output, and delay circuit 83, so that the voltage at node or junction B is not delivered to delay 83 when inhibit gate 102 is actuated. Inhibit gate 102 is actuated by gating circuit 100 which simultaneously provides an equivalent quench voltage to junction A to prevent avalanche photodiode 12c from detecting any impinging photons, thereby avoiding the problem of having avalanches when the circuit is disabled.

Figure 9:
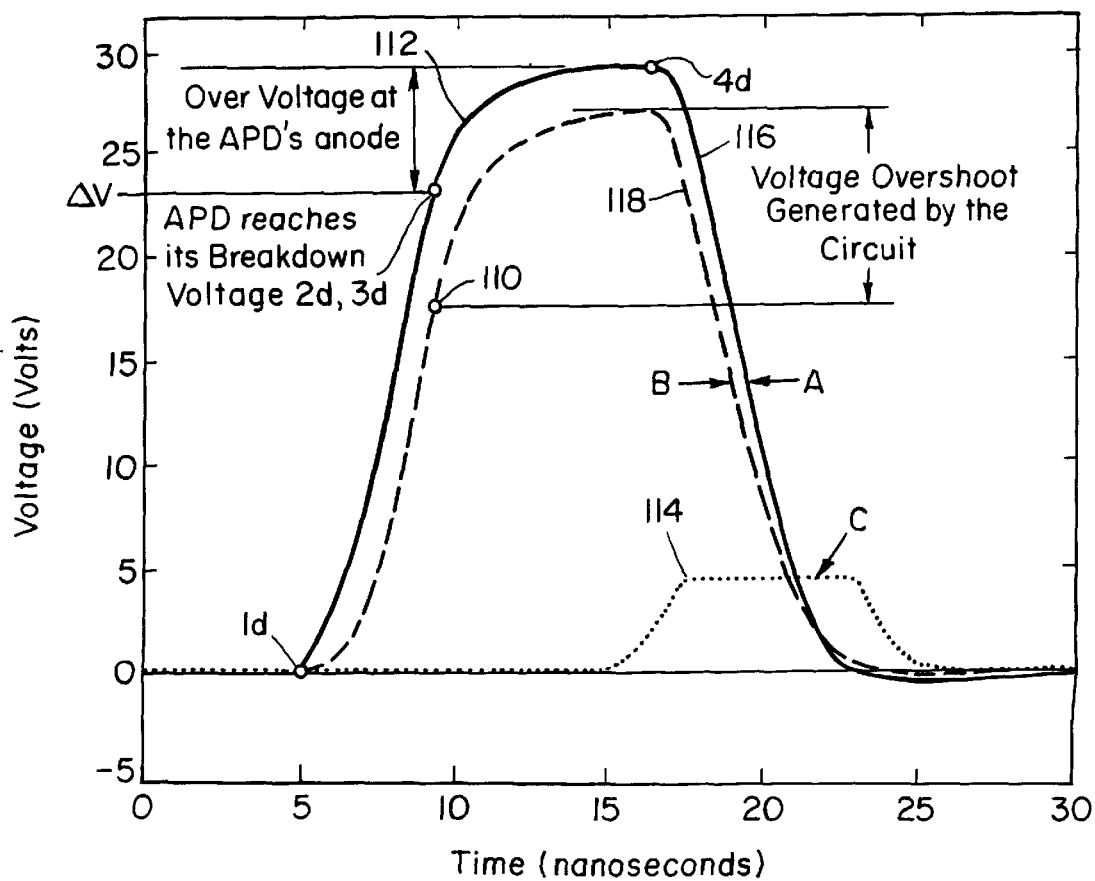
FIG. 9 is an illustration of the switching characteristic of the avalanche diode and current amplifier circuit of FIG. 8 showing the effect of the reset action.

The timing of the voltages applied at junctions A, B and C can be seen more clearly in FIG. 9, where the voltage at junction A is shown full line, at junction B is shown in dashed line, and at junction C is shown in dotted line. There it can be seen that the voltage at junctions A and B begins at point 1d and moves upwardly with the voltage at junction A leading that at junction B. At junction B the current overshoot which develops the quenching voltage on capacitor 74 begins at point 110. When the avalanche photodiode reaches its breakdown voltage at points 2d, 3d, the voltage output would normally stop, but the continued overshoot beginning at 110 provided at junction B is fed back through capacitor 74 to provide the overvoltage 112 at the anode of the avalanche device 12c. This continues until the reset voltage at junction C reaches a point 114 to trip the switches 86, 88 and 90 at point 4d so that the voltages on junctions A and B both begin to decrease along paths 116 and 118.

Figure 10:
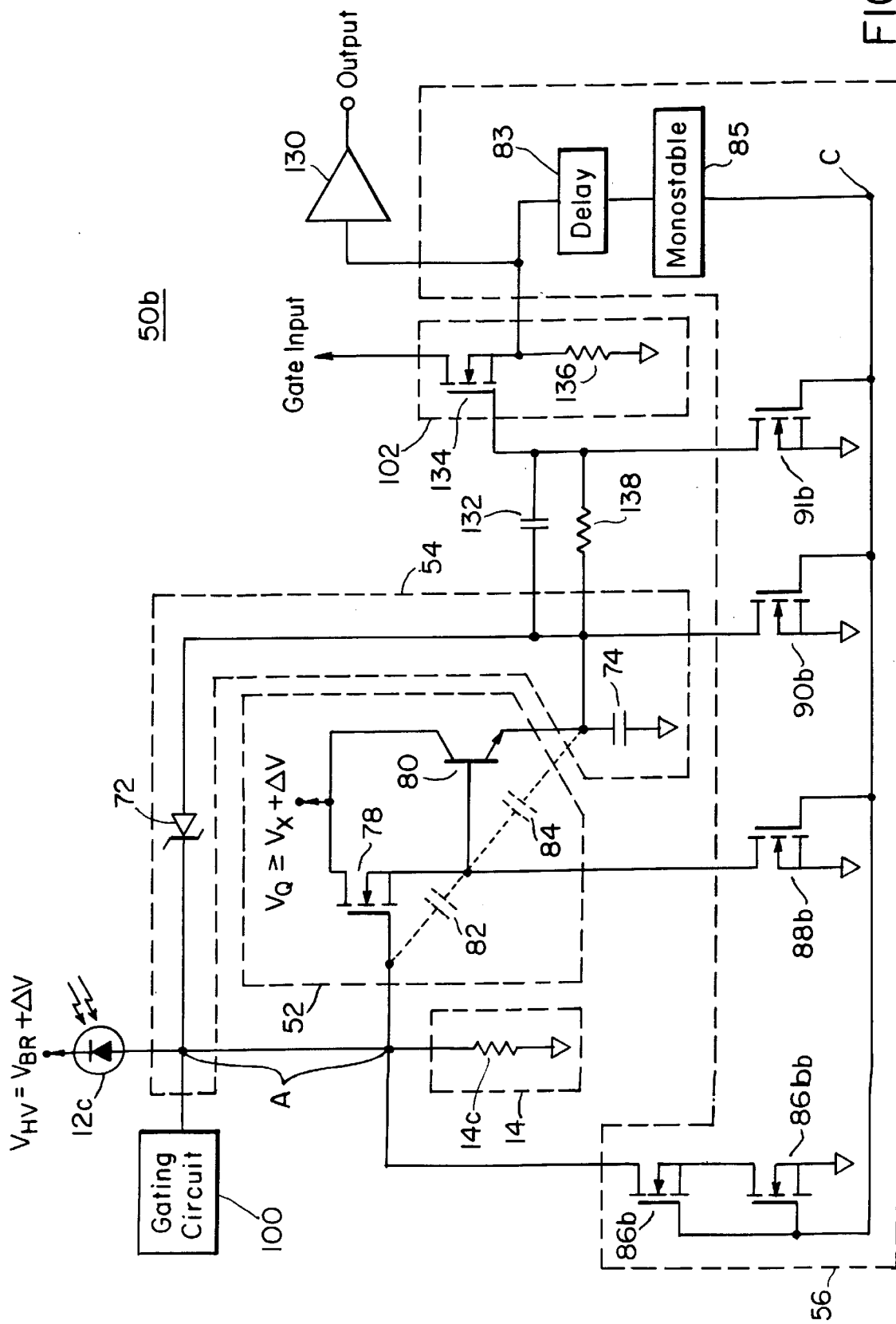
FIG. 10 is a schematic diagram of another construction of the quench circuit of FIG. 5.

In another construction the active quench circuit according to this invention 50a may be configured 50b, FIG. 10, using FETs in 86b and 86bb place of switch 86 and FETs 88b and 90b in place of switches 88 and 90. The two FETs 86b and 86bb are used to further decrease the capacitance at junction A. A driver amplifier 130 has been added in the output in FIG. 10 and a capacitor 132 has been added to ensure that even if an avalanche occurs during reset the voltage will be low enough to trigger the inhibit circuit 102 which is shown as including FET 134 and resistor 136. Resistor 138 is added in parallel with capacitor 132 in order to keep a proper bias. An additional switch implemented by FET 91b is provided to discharge capacitor 132.

Figure 11:
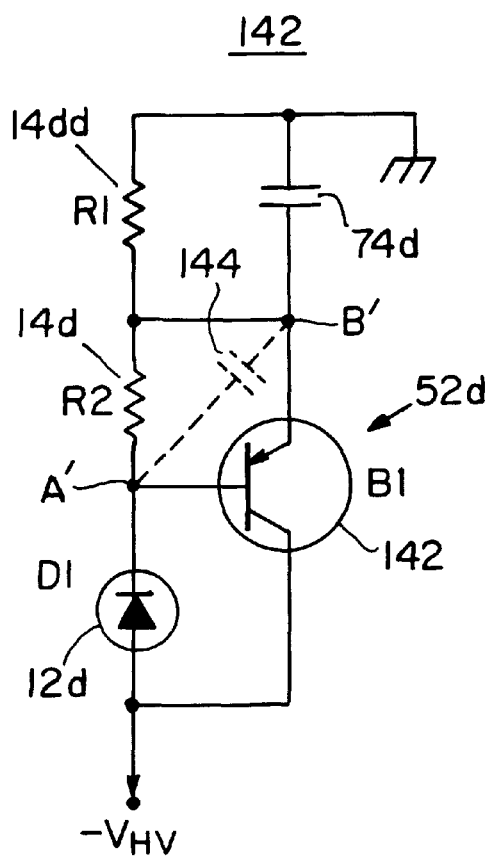
FIG. 11 is a schematic diagram of another embodiment of the quench circuit according to this invention.

In another embodiment active quench circuit 142, FIG. 11, has the avalanche device interconnected oppositely to that shown in the circuits of FIGS. 5, 8 and 10. In FIG. 11 avalanche device 12d has its anode connected to $-V_{HV}$ and its cathode connected at junction A' to the series resistors 14d and 14dd. Junction A' is also connected to the base of PNP transistor 142 which forms a part of the current amplifier circuit 52d and has an intrinsic capacitance 144 between its emitter and base. Quenching capacitor 74d is connected from the emitter of transistor 142 to ground along with the other end of resistor 14dd. With $-V_{HV}$ applied to the anode, the cathode at junction A is at zero and transistor 142 is not conducting. Capacitor 74d is also at zero volts. The avalanche device 12d is at a voltage equivalent to the breakdown voltage $V_{BR}+\Delta V$. At this point, if a photon were to impinge on avalanche device 12d the avalanche current starts and the cathode at junction A' moves to voltage $-\Delta V$. Transistor 142 then begins to track the voltage at junction A'. When that voltage reaches $-\Delta V$ the avalanche stops but transistor 142 continues to conduct because of its slower turn-off speed. Junction B' between capacitor 74d and the emitter of transistor 142, which was originally at zero volts, has been tracking the cathode voltage and continues to go down even after the avalanche current stops, giving an overshoot current which charges capacitor 74d to provide the quench voltage which is fed back through the emitter-base intrinsic capacitance 144 to create an overvoltage $\Delta V+V_X$ to empty all the carriers in the avalanche device 12d and prevent a restart. Passive reset will occur through the charging of capacitor 74d and resistor 14dd.

Figure 12:
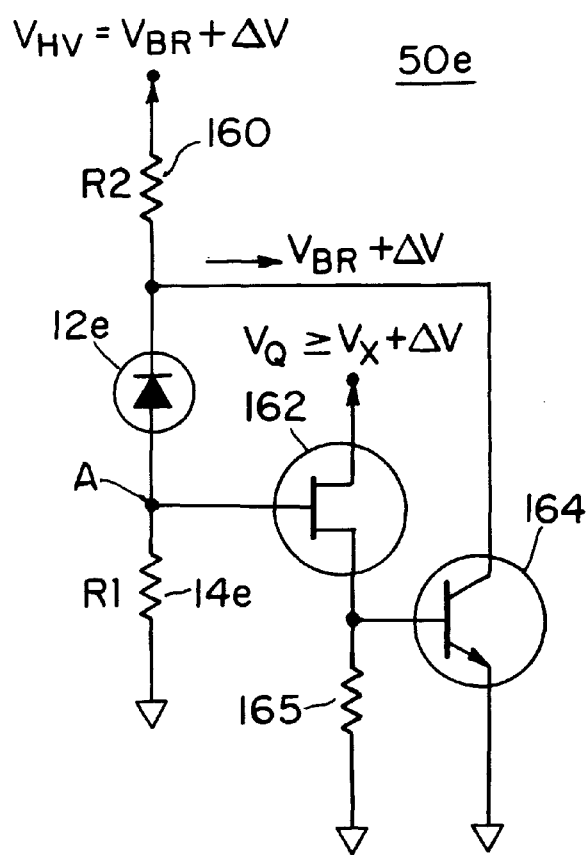
FIG. 12 is a schematic diagram of another embodiment of the quench circuit according to this invention.

In another embodiment 50e, FIG. 12, the voltage across avalanche device 12e is reduced from both electrodes, the anode and the cathode. $V_{HV}$ is applied through cathode resistance 160 to the cathode of avalanche device 12e, whose anode is connected at junction A through biasing resistor 14e. Junction A is connected to the base or gate of FET transistor 162 which has its drain terminal connected to $V_Q$ (a voltage equal or larger than $\Delta V+V_X$), its source terminal connected to the base of transistor 164 and through the resistor 165 to ground. The output from FET transistor 162 is delivered to the base of NPN transistor 164 which has a characteristically slower turn-off speed than the avalanche speed of avalanche device 12e. To begin with, the anode of avalanche device 12e is at zero volts, and when the avalanche current begins the anode moves up from zero toward $\Delta V$. Simultaneously, the cathode moves down from $+H_V$. This reduces the voltage across the avalanche device from both directions or both electrodes until the bias across it has been reduced by $\Delta V$ leaving the voltage across it at the breakdown voltage $V_{BR}$. Transistor 162 now turns on as the anode voltage approaches $\Delta V$. Transistor 162 in turn turns on transistor 164 which follows the anode voltage. When the anode reaches $+\Delta V$ the current through the avalanche device 12e ceases but the slower turn-off speed of transistor 164 causes it to continue to conduct. This creates a drop in voltage $V_X$ across cathode resistor 160 in excess of the breakdown voltage plus the $\Delta V$, thereby applying a quenching voltage to reset the circuit.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. An active quench circuit for an avalanche current device comprising:
   means for applying a bias voltage to reverse bias an avalanche current device above its avalanche breakdown voltage;
   a current amplifier circuit having a turn-off speed slower than the avalanche speed of the avalanche device and responsive to the avalanche current of the avalanche device for generating an overshoot current continuing after the end of the avalanche current; and
   a feedback circuit responsive to said overshoot current for generating a quenching voltage for reducing the bias voltage below the avalanche breakdown voltage to quench the avalanche current of the avalanche device.

2. The active quench circuit of claim 1 wherein said current amplifier and said feedback circuit each have an intrinsic capacitance and further including a reset circuit responsive to said quenching voltage to recharge the capacitance of the avalanche current device, and discharge said intrinsic capacitance of said current amplifier circuit and said feedback circuit for reestablishing said bias voltage above said avalanche breakdown voltage.

3. The active quench circuit of claim 2 in which said reset circuit includes inhibit means for selectively inhibiting said quenching voltage application to said reset circuit.

4. The active quench circuit of claim 3 in which said reset circuit further including gating means for actuating said inhibit means and applying an equivalent quenching voltage to the avalanche current device to maintain the avalanche current device below the avalanche breakdown voltage while said reset current is inhibited.

5. The active quench circuit of claim 2 in which said reset circuit includes switching means for discharging said intrinsic capacitance of said current amplifier and feedback circuit and recharging the avalanche current device.

6. The active quench circuit of claim 5 in which said reset circuit includes pulse generating means for producing a pulse to operate said switching means for a predetermined period of time.

7. The active quench circuit of claim 6 in which said reset circuit includes delay means, responsive to said current amplifier circuit, for actuating said pulse generating means after said quenching voltage has been generated.

8. The active quench circuit of claim 5 in which said current amplifier circuit includes a high impedance low capacitance semiconductor switch interconnected between said avalanche device and said means for applying a bias for isolating said bipolar transistor and avalanche device, and said semiconductor switch has a faster turn-on and turn-off speed than said bipolar transistor.

9. The active quench circuit of claim 8 in which said semiconductor switch includes a second switching device interconnected at said junction with said bipolar transistor and semiconductor buffer for discharging their intrinsic capacitance.

10. The active quench circuit of claim 5 in which said switching means includes a first switching device interconnected at a junction with said means for applying for recharging the intrinsic capacitance of the avalanche device and discharging the intrinsic capacitance of the input of said current amplifier circuit.

11. The active quench circuit of claim 2 in which said feedback circuit includes a quenching capacitor for generating said quenching voltage from said overshoot current.

12. The active quench circuit of claim 1 in which said current amplifier circuit includes bipolar transistor having a turn-off speed slower than the avalanche speed of the avalanche device.

13. The active quench circuit of claim 12 in which said current amplifier circuit includes a high impedance low capacitance semiconductor buffer interconnected between said avalanche device and said means for applying a bias for isolating said bipolar transistor and avalanche device, and said semiconductor buffer has a faster turn-on and turn-off speed than said bipolar transistor.

14. The active quench circuit of claim 12 in which said feedback circuit includes an intrinsic capacitance of said bipolar transistor for interconnecting said quenching voltage to said means for applying.

15. The active quench circuit of claim 12 in which said feedback circuit includes an intrinsic capacitance of said bipolar transistor and semiconductor switch for interconnecting said quenching voltage with said means for applying.

16. The active quench circuit of claim 1 in which said feedback circuit includes a quenching capacitor for generating said quenching voltage from said overshoot current.

17. The active quench circuit of claim 16 in which said semiconductor switch includes a third switching device interconnected with said quenching capacitor for discharging it.

18. The active quench circuit of claim 1 in which said feedback circuit includes a Schottky diode for interconnecting said quenching voltage to said means for applying.

19. The active quench circuit of claim 1 in which said feedback circuit includes a feedback capacitor for interconnecting said quenching voltage to said means for applying.

* * * * *